United States Patent
Choi et al.

(10) Patent No.: US 8,008,706 B2
(45) Date of Patent: Aug. 30, 2011

(54) NON-VOLATILE MEMORY CELL AND NON-VOLATILE MEMORY CELL ARRAY WITH MINIMIZED INFLUENCE FROM NEIGHBORING CELLS

(75) Inventors: Yang-Kyu Choi, Daejeon (KR); Kuk-Hwan Kim, Daejeon (KR)

(73) Assignee: Korea Advanced Institute of Science and Technology (KR)

( * ) Notice: Subject to any disclaimer, the term of this patent is extended or adjusted under 35 U.S.C. 154(b) by 601 days.

(21) Appl. No.: 12/048,449

(22) Filed: Mar. 14, 2008

(65) Prior Publication Data
US 2008/0277719 A1    Nov. 13, 2008

(30) Foreign Application Priority Data
Mar. 14, 2007    (KR) ................. 10-2007-0024835

(51) Int. Cl.
*H01L 29/788* (2006.01)
(52) U.S. Cl. ............. 257/316; 257/315; 257/E21.209
(58) Field of Classification Search .......... 257/315, 257/316
See application file for complete search history.

(56) References Cited

U.S. PATENT DOCUMENTS
2004/0238879 A1 * 12/2004 Endoh et al. ............ 257/315
2007/0004137 A1    1/2007 Oh et al.
* cited by examiner

*Primary Examiner* — Marcos D. Pizarro
*Assistant Examiner* — Eva Yan Montalvo
(74) *Attorney, Agent, or Firm* — The Belles Group, P.C.

(57) ABSTRACT

The present invention relates to a non-volatile memory cell and a method of fabricating the same. The non-volatile memory cell according to the present invention comprises a substrate, a first oxide film formed over an active region of the substrate, a source and drain formed within the active region, a charge storage unit formed on the first oxide film, a second oxide film configured to surround the charge storage unit and formed on the first oxide film, and a gate formed to surround the second oxide film. According to the non-volatile memory cell and a cell array including the same in accordance with the present invention, the charge storage unit is fully surrounded by the gate or the gate line, thus a disturbance phenomenon that may occur due to the memory operation of cells formed in other neighboring gate or gate line can be minimized.

20 Claims, 8 Drawing Sheets

(a)

(b)

NON-VOLATILE MEMORY CELL AND NON-VOLATILE MEMORY CELL ARRAY WITH MINIMIZED INFLUENCE FROM NEIGHBORING CELLS

This Nonprovisional application claims priority under 35 U.S.C. §119(a) on Patent Application No. 10-2007-0024835 filed in Republic of Korea on Mar. 14, 2007, the entire contents of which are hereby incorporated by reference.

BACKGROUND OF THE INVENTION

1. Field of the Invention

The present invention relates to a non-volatile memory cell and a method of fabricating the same, and more particularly, to a non-volatile memory cell, a cell array including the non-volatile memory cell, and a method of fabricating the cell array.

2. Discussion of Related Art

Semiconductor memory devices can be classified into volatile memory devices and non-volatile memory devices. The volatile memory devices do not retain its data when power is off, and the non-volatile memory devices can retain its data even when power is not supplied. Hence, the non-volatile memory devices have been widely used for a situation where power is not supplied or the supply of power is stopped temporarily, or when the use of a low voltage is required in mobile phone systems, memory cards for storing music and/or video data, and other application devices.

Today, for high integration and miniaturization required for the semiconductor market, the size of the device itself must be reduced and a reduction in the size indispensably narrows the gap between unit cells. However, problems arise because electric charges stored in the unit cell may have an effect on the operation of neighboring unit cells due to the reduction in the gap between the unit cells and an electric charge generated by a high voltage over 10V which is applied to the gates of some unit cells may change the state of neighboring cells arbitrarily.

SUMMARY OF THE INVENTION

Accordingly, the present invention is to provide a non-volatile memory cell which can minimize the influence by neighboring cells when a unit cell is operated, and a method of fabricating the same.

Further, the present invention is to provide a high-integrated non-volatile memory cell and a method of fabricating the same.

To accomplish the technical objects, a non-volatile memory cell in accordance with an embodiment of the present invention comprises a substrate; a first oxide film formed over an active region of the substrate; a source and drain formed within the active region; a charge storage unit formed on the first oxide film; a second oxide film configured to surround the charge storage unit and formed on the first oxide film; and a gate formed to surround the second oxide film.

The charge storage unit may be formed from carbon nanotube (CNT), fullerene, nitride or nanocrystalline material.

The gate may include polysilicon or metal.

The metal may have a work function of 4.2 eV to 5.1 eV.

A non-volatile memory cell array in accordance with another embodiment of the present invention comprises a substrate; an element isolation unit to define a plurality of active regions in the substrate; a source and drain formed within each of the plurality of active regions; a first oxide film formed on each of the plurality of active regions; a charge storage unit formed on the first oxide film; a second oxide film configured to surround the charge storage unit and formed on the first oxide film, and gate lines configured to surround the plurality of second oxide films disposed on the same signal processing line and connecting electrically the second oxide films.

The charge storage unit may be formed from carbon nanotube (CNT), fullerene, nitride or nanocrystalline material.

The gate may include polysilicon or metal.

The metal may have a work function of 4.2 eV to 5.1 eV.

A method of fabricating a non-volatile memory cell array in accordance with another embodiment of the present invention comprises the steps of (a) sequentially forming a first oxide film, a charge storage unit, and a second oxide film surrounding the charge storage unit, over a substrate; (b) forming a first gate material on the second oxide film; (c) forming an etch mask film on the first gate material and patterning the etch mask film; (d) etching the substrate to form trenches in the substrate by using the etch mask film as a mask; (e) forming an element isolation unit to define the active region over the trenches; (f) removing the etch mask film; (g) forming a second gate material to electrically connect the first gate materials formed on the same signal processing line; and (h) forming a source and a drain within the active region of the substrate.

The step (e) may include the steps of forming a trench gap-fill insulating material on the trenches and the etch mask films; and forming the element isolation unit by polishing or etching the trench gap-fill insulating material.

The charge storage unit may be formed from carbon nanotube (CNT), fullerene, nitride or nanocrystalline material.

The first and second gate material may include polysilicon or metal.

The metal may have a work function of 4.2 eV to 5.1 eV.

DETAILED DESCRIPTION OF PREFERRED EMBODIMENTS

The present invention will now be described in detail in connection with specific embodiments with reference to the attached drawings.

Figure 1:
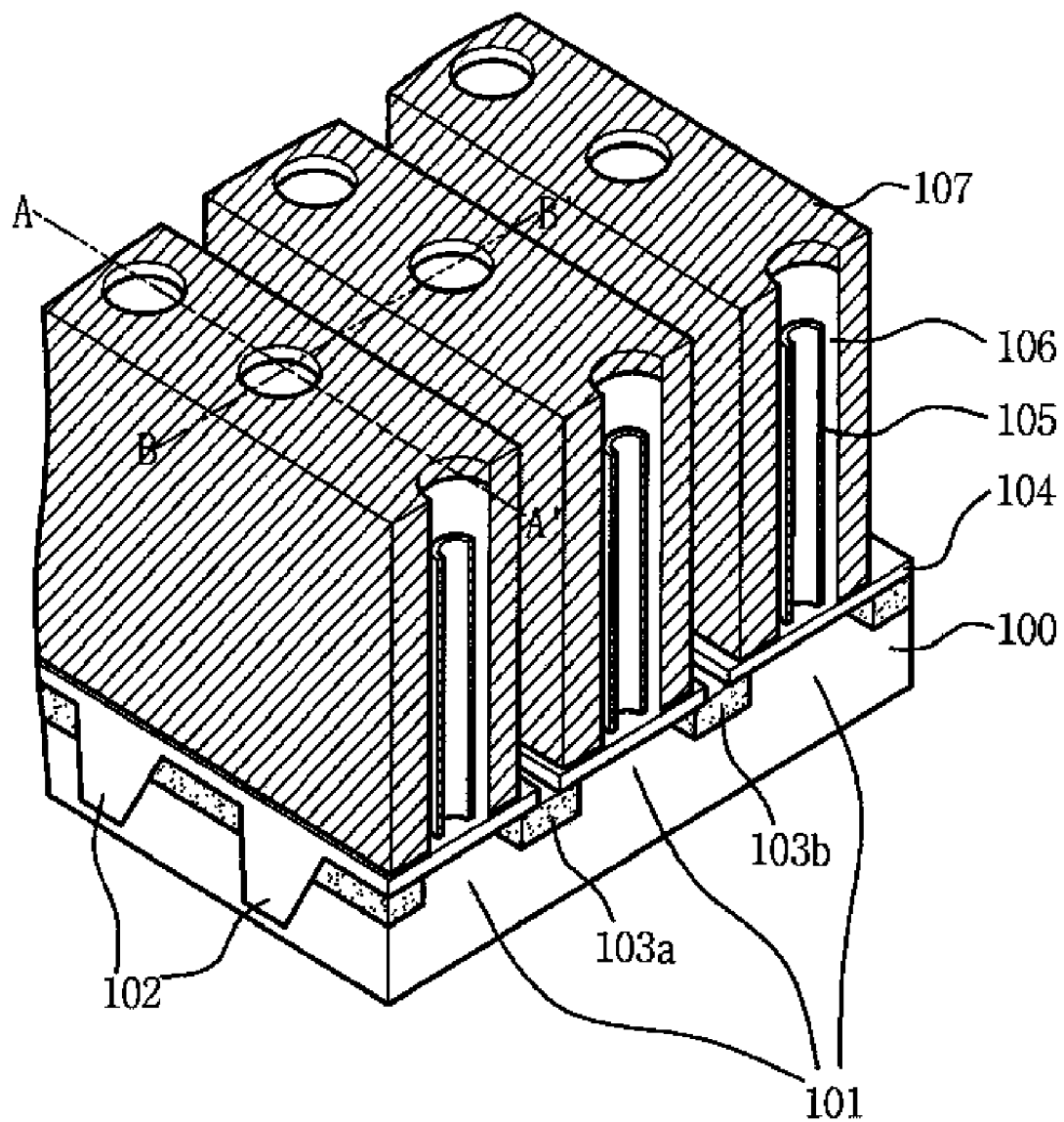
FIG. 1 is a three-dimensional view of a cell array including a non-volatile memory cell in accordance with an embodiment of the present invention.

FIG. 1 is a three-dimensional view of a cell array including a non-volatile memory cell in accordance with an embodiment of the present invention, and FIG. 2(a) is a sectional view of the non-volatile memory cell array of FIG. 1 taken along line A-A' and FIG. 2(b) is a sectional view of the non-volatile memory cell array of FIG. 1 taken along line B-B'.

First of all, referring first to FIG. 1, a non-volatile memory cell in accordance with an embodiment of the present invention includes a substrate 100, a first oxide film 104 formed on an active region 101 of the substrate 100, a source 103a and a drain 103b formed within the active region 101, a charge storage unit 105 formed on the first oxide film 104, a second oxide film 106 configured to surround the charge storage unit 105 and formed on the first oxide film 104, and a gate 107 formed to surround the second oxide film 106.

Referring to FIG. 2(a), the active region 101 of the substrate 100 is defined by an element isolation unit 102. The source 103a and the drain 103b are formed in the active region 101. A channel between the source 103a and the drain 103b can be formed in the active region 101.

The first oxide film 104 is formed over the active region 101 of the substrate 100. The first oxide film 104 may be formed to a thickness of about 80 Å or less.

The charge storage unit 105 is formed on the first oxide film 104. The charge storage unit 105 is a charge storage medium for a non-volatile memory. In the present invention, carbon nanotube (CNT) 105 as the charge storage units 105 is formed vertically on the first oxide film 104. The carbon nanotube (CNT) 105 as the charge storage medium is, as a carbon allotrope composed of carbon which exists on the earth in large quantities, material in which one carbon is bonded with the other carbon atom in a hexagon beehive fashion and formed of a tube form, and material of a very small area in which the diameter of the tube is nanometer (nm=1/1 billion meters). The physical size of the non-volatile memory cell of the present invention can be further reduced by using the carbon nanotube (CNT) of the nanometer level as the charge storage medium. However, it is to be understood that the charge storage unit 105 is not limited to only carbon nanotube (CNT), and it may employ any material for storing electric charges for the non-volatile memory. For example, the charge storage unit 105 may employ any one of fullerene $C_{60}$, nanocrystalline and nitride, which is a molecule comprised of 60 carbon atoms and having a ball form and has a robust structure and an excellent charge transfer characteristic. The second oxide film 106 is configured to fully surround a surface of the carbon nanotube (CNT) 105 and is formed on the first oxide film 104. The second oxide film 106 may be formed to a thickness of about 200 Å or less.

The gate 107 is formed on a surface of the second oxide film 106 that fully surrounds the carbon nanotube (CNT) 105 formed on the first oxide film 104. The gate 107 may be formed of doped polysilicon or metal. The metal may be formed of metal having the work function of 4.2 eV to 5.1 eV. This is because if the gate 107 is formed of metal having 4.2 eV or less, there is a problem that the characteristic of the metal itself is changed in a subsequent process after the gate is patterned, and if the gate 107 is formed of metal having 5.1 eV or more, there is a problem that it is difficult to pattern the gate 107.

Figure 2:
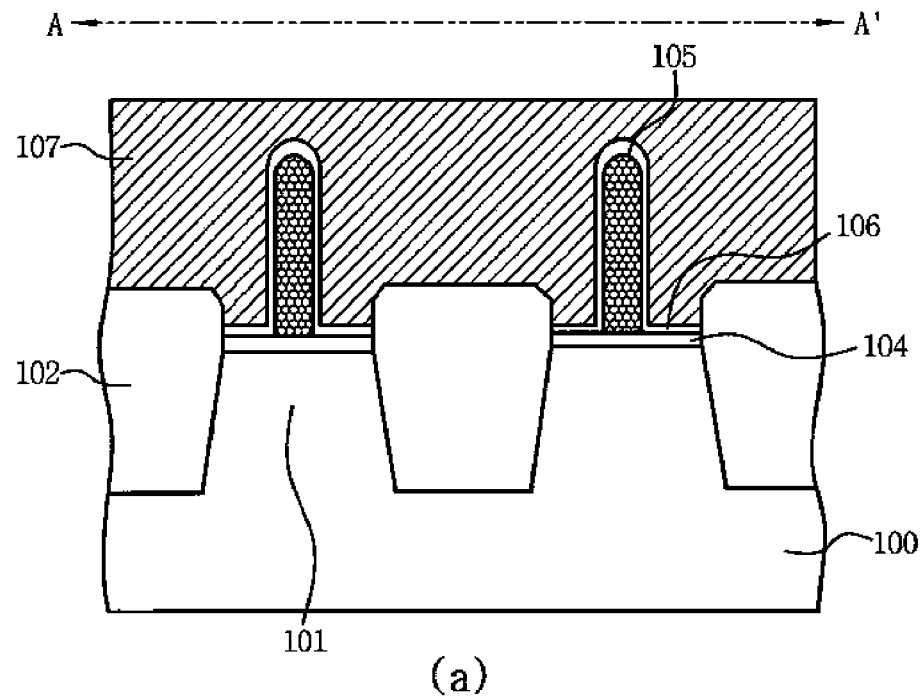
FIG. 2(a) is a sectional view of the non-volatile memory cell array of FIG. 1 taken along line A-A'.
FIG. 2(b) is a sectional view of the non-volatile memory cell array of FIG. 1 taken along line B-B'.
Figure 2:
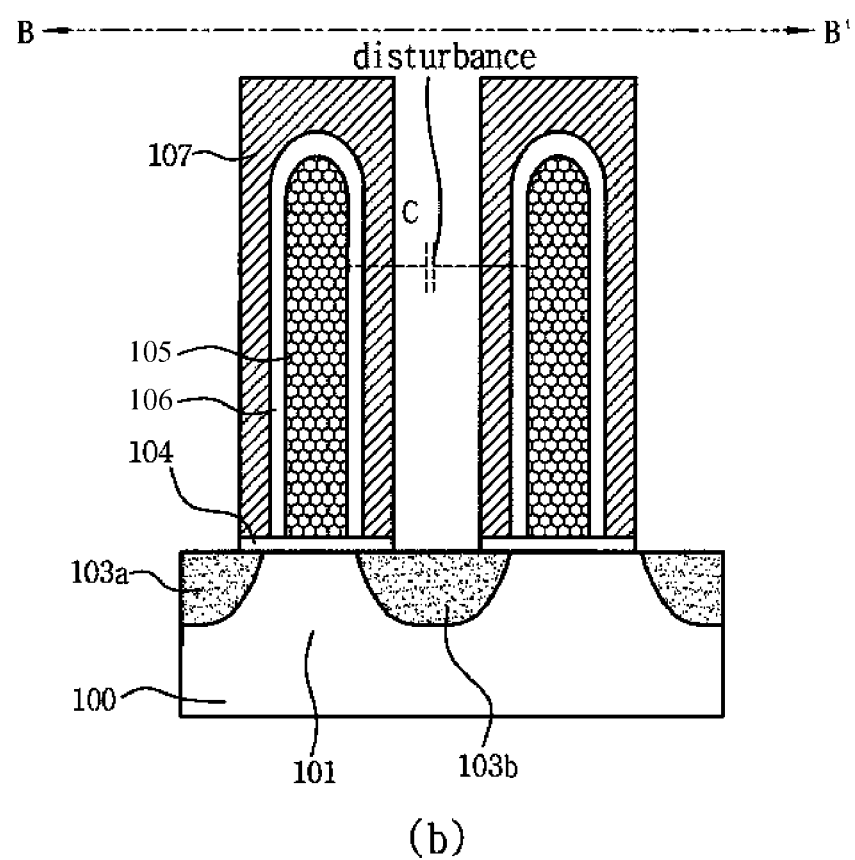

Referring to FIG. 1 to FIG. 2(a), the non-volatile memory cell array including the non-volatile memory cell in accordance with an embodiment of the present invention includes the substrate 100, the element isolation unit 102 defining the plurality of active regions 101 in the substrate 100, the source 103a and the drain 103b formed within the plurality of active regions 101, the first oxide film 104 formed on the plurality of active regions 101, the charge storage units 105 formed on the first oxide film 104, the second oxide film 106 configured to surround the charge storage units 105 and formed on the first oxide film 104, and the gate lines 107 configured to surround the plurality of second oxide films 106 disposed on the same signal processing line and electrically connect the second oxide films 106.

The element isolation unit 102 limits and defines the plurality of active regions 101 of the substrate 100. The element isolation unit 102 can reduce a disturbance phenomenon between the plurality of charge storage units 105 surrounded by the gate lines 107.

The gate lines 107 surround the plurality of second oxide films 106 surrounding the plurality of charge storage units 105 disposed on the same signal processing line and electrically connect the second oxide films 106. The gate line 107 may be formed from polysilicon or metal. The metal may be formed from metal having the work function of 4.2 eV to 5.1 eV.

In the non-volatile memory cell and the non-volatile memory cell array including the same in accordance with an embodiment of the present invention, the carbon nanotube (CNT) 105 (i.e., a charge storage medium) is formed only on the active region 101 where the active region 101 and the gate line 107 cross each other, and the gate lines 107 directly come in contact with the element isolation unit 102. The carbon nanotubes (CNTs) 105 are fully surrounded by the second oxide films 106 and the gate lines 107, therefore the carbon nanotubes (CNTs) 105 are fully separated from one another as a cell unit and the carbon nanotubes (CNTs) 105 surrounded by the second oxide films 106 and the gate lines 107 are influenced by only an electric field of voltage applied to the gate lines 107. Further, a pitch of the active region 101 and the element isolation unit 102 is reduced or a distance between the plurality of gate lines 107 is decreased due to the reduction in the size of the cell array, thus a disturbance phenomenon between neighboring cells that may be caused accordingly can be minimized.

FIGS. 3 to 8 are views illustrating a method of fabricating a non-volatile memory cell array in accordance with an embodiment of the present invention. A method of fabricating the non-volatile memory cell array comprises, the steps of (a) sequentially forming a first oxide film 300, a charge storage unit 305, and a second oxide film 306 surrounding the charge storage unit, over a substrate 300; (b) forming a first gate material 307a on the second oxide film 306; (c) forming an etch mask film 308 on the first gate material 307a and patterning the etch mask film 308; (d) etching the substrate 300 to form trenches 309 in the substrate by using the etch mask film 308 as a mask; (e) forming an element isolation unit 302 to define the active region 301 over the trenches 309; (f) removing the etch mask film 308; (g) forming a second gate material 308b to electrically connect a plurality of the first gate materials 308a formed on the same signal processing line; and (h) forming a source and a drain within the active region 301 of the substrate 300.

Figure 3:
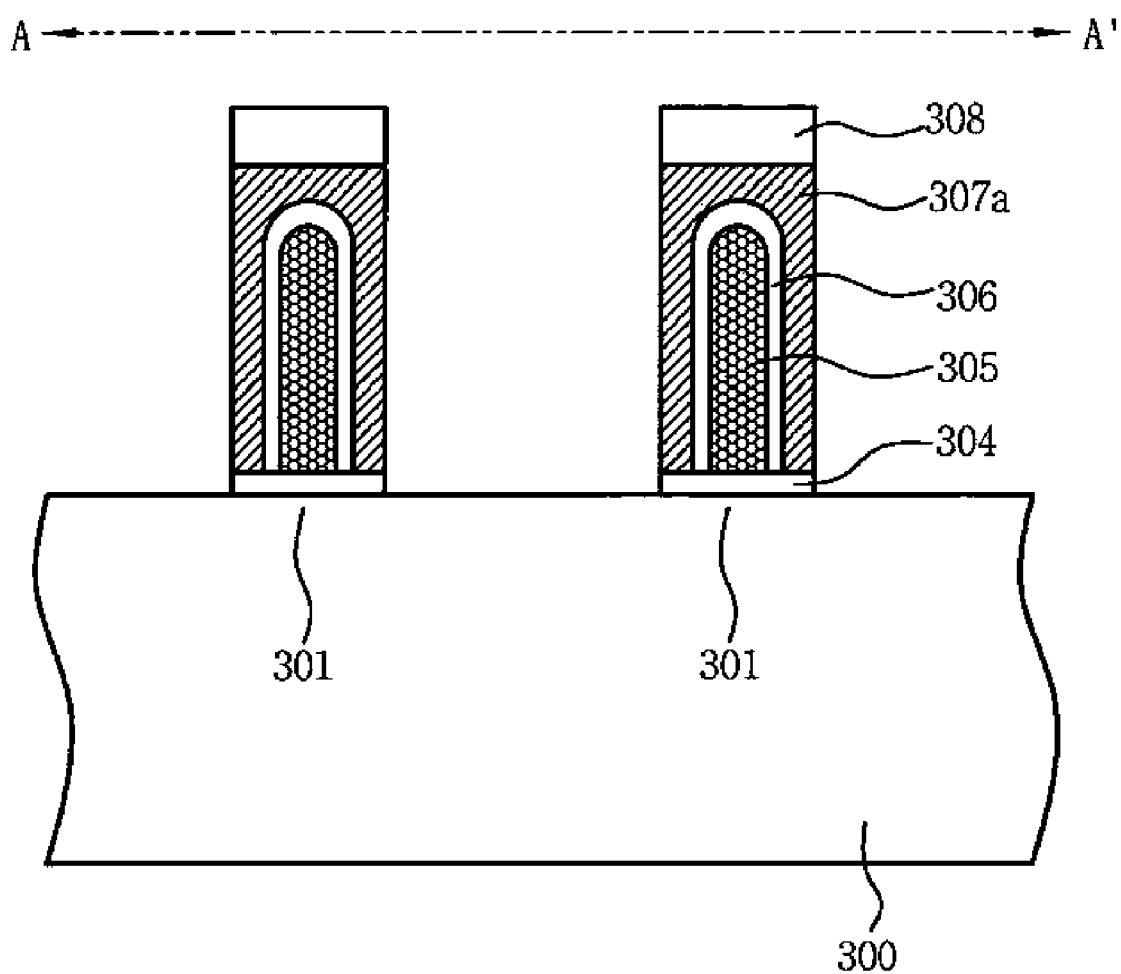
FIGS. 3 to 8 are views illustrating a method of fabricating a non-volatile memory cell array in accordance with an embodiment of the present invention.

As shown in FIG. 3, the first oxide film 304, the charge storage unit 305, and the second oxide film 306 surrounding the charge storage unit 305 are sequentially formed over the substrate 300. The first oxide film 304 may be formed to a thickness of about 80 Å or less, and the charge storage unit 305 (i.e., a charge storage medium) may be formed from carbon nanotube (CNT) 305. The charge storage unit 305 is not limited to the carbon nanotube (CNT) 305 and may form by using any one of fullerene, nanocrystalline and nitride.

The carbon nanotube (CNT) 305 is formed vertically on a specific region of the first oxide film 304 by using a thermal chemical vapor deposition method, a plasma vapor deposition method or the like. The second oxide film 306 is formed to a thickness of about 200 Å or less in such a way to surround the carbon nanotube (CNT) 305.

Subsequently, the first gate material 307a is formed to surround the second oxide film 306, and the etch mask film 308 is formed on the first gate material 307a. The etch mask film 308 is used as a polishing-stop layer in a polishing process to be described later on and may be formed from the silicon nitride film.

The first gate material 307a may be formed from doped polysilicon or metal having the work function of 4.2 eV to 5.1 eV. The first gate material 307a is patterned in a subsequent process and is used as a part of the gate line 307.

Subsequently, the etch mask film 308 is patterned. A surface of the substrate 300 in which the element isolation unit 302 will be formed is exposed by using the patterned etch mask film 308 as a mask. In this case, the substrate 300 may be preferably etched such that the first gate material 307a surrounds the second oxide film 306.

Figure 4:
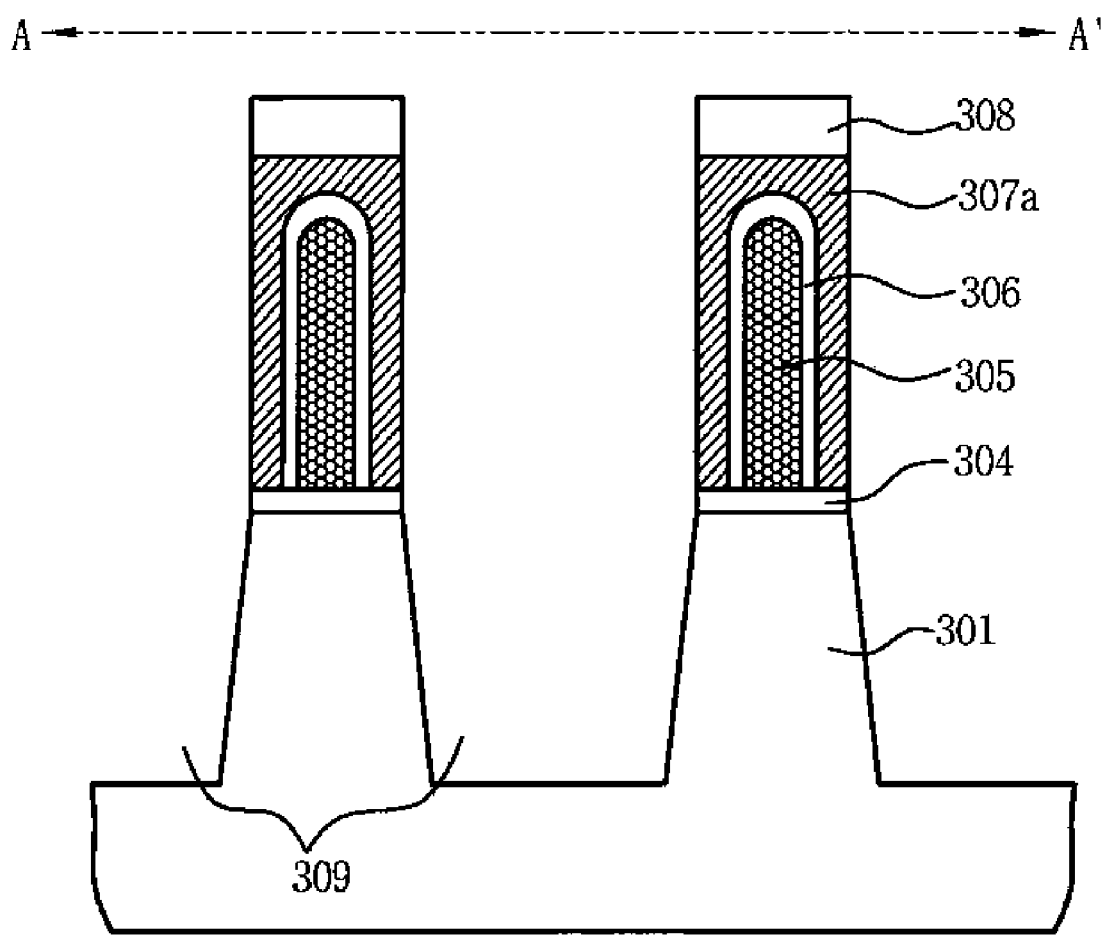

Referring to FIG. 4, the exposed surface of the substrate 300 is etched to a specific depth by using the patterned etch mask film 308. The plurality of trenches 309 being parallel with the substrate 300 are formed by this etch process. As a result, upper protruded regions of the substrate 300 other than the trench (309) regions (i.e., regions covered with the first oxide film 304) are defined as the active regions 301. Consequently, the carbon nanotube (CNT) 305 and the first gate material 307a are formed over the active region 301 in a self-aligned manner.

Subsequently, the element isolation unit 302 to define the active regions 301 is formed over the trenches 309. In this case, the process of forming the element isolation unit 302 to define the active regions 301 over the trenches 309 may further include the processes of forming a trench gap-fill insulating material 310 over the trenches 309 and the etch mask films 308, and forming the element isolation unit 302 by polishing or etching the trench gap-fill insulating material 310. The processes are described below with reference to FIGS. 5 and 6.

Figure 5:
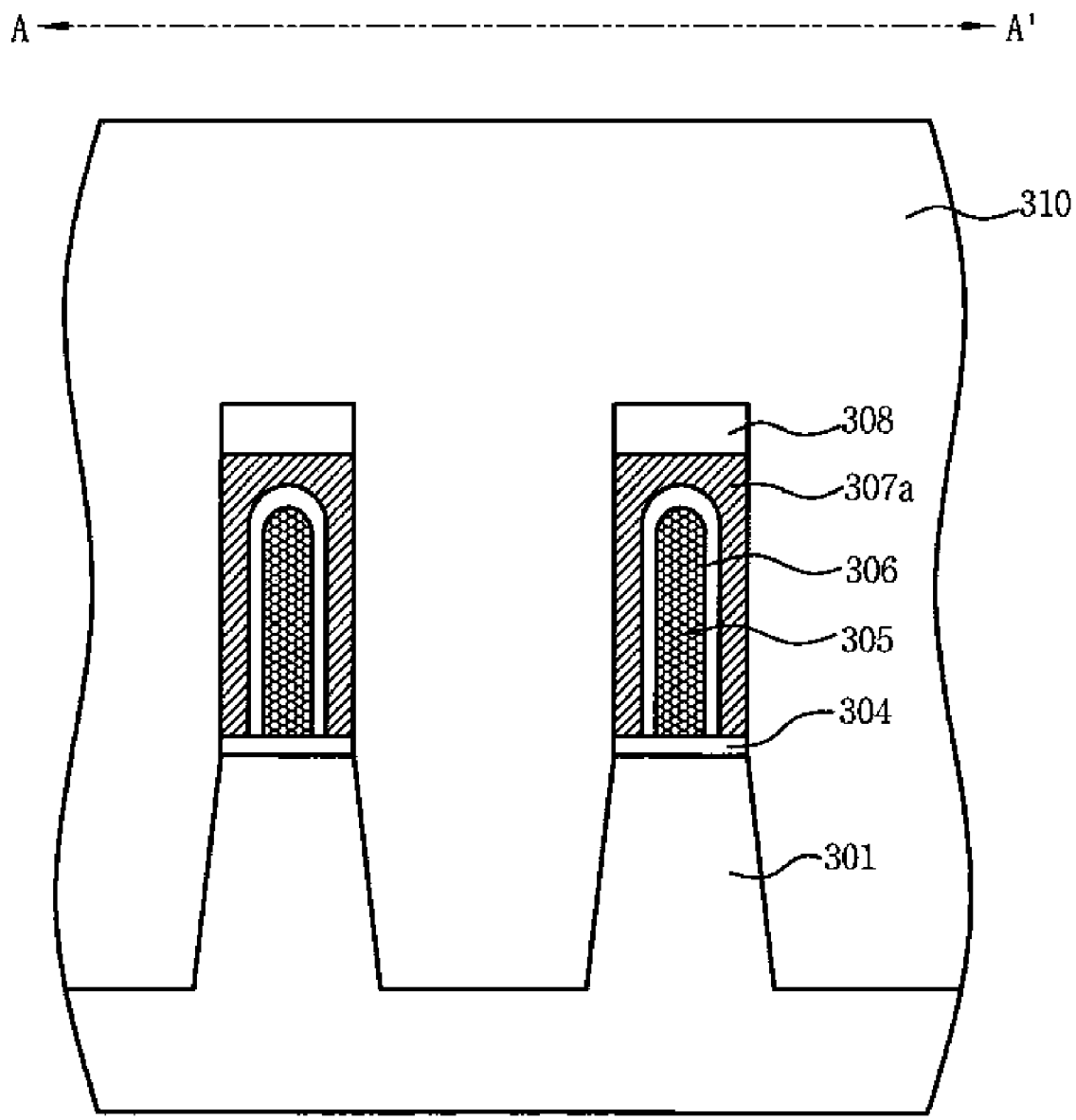

Referring to FIG. 5, the trench gap-fill insulating material 310 is formed on the patterned etch mask film 308 so that the trenches 309 are fully gap-filled. The trench gap-fill insulating material 310 may be formed by using a chemical vapor deposition oxide film.

Figure 6:
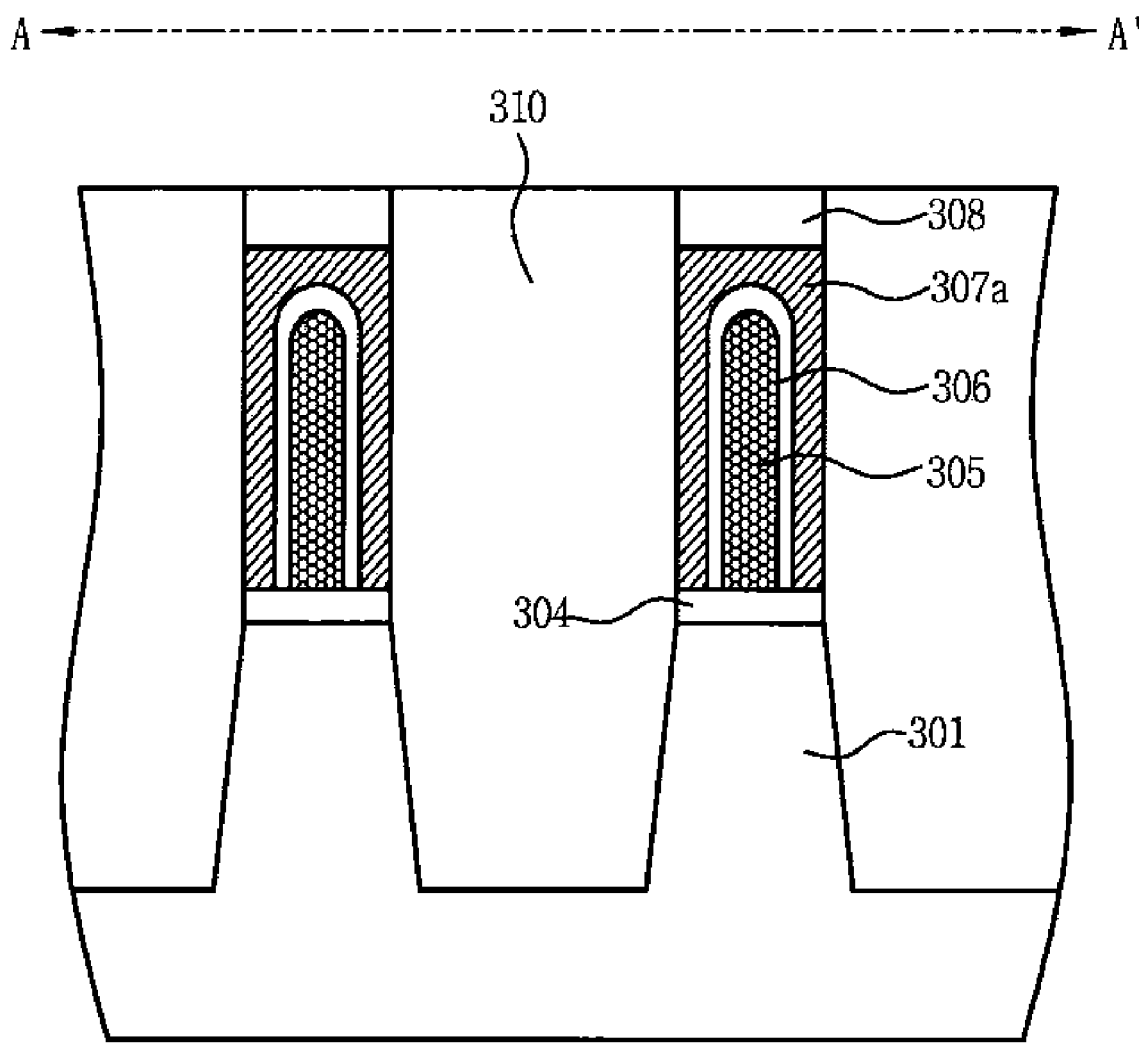

Referring to FIG. 6, a polishing and etching process is performed on the trench gap-fill insulating material 310 until the etch mask film 308 is exposed.

Figure 7:
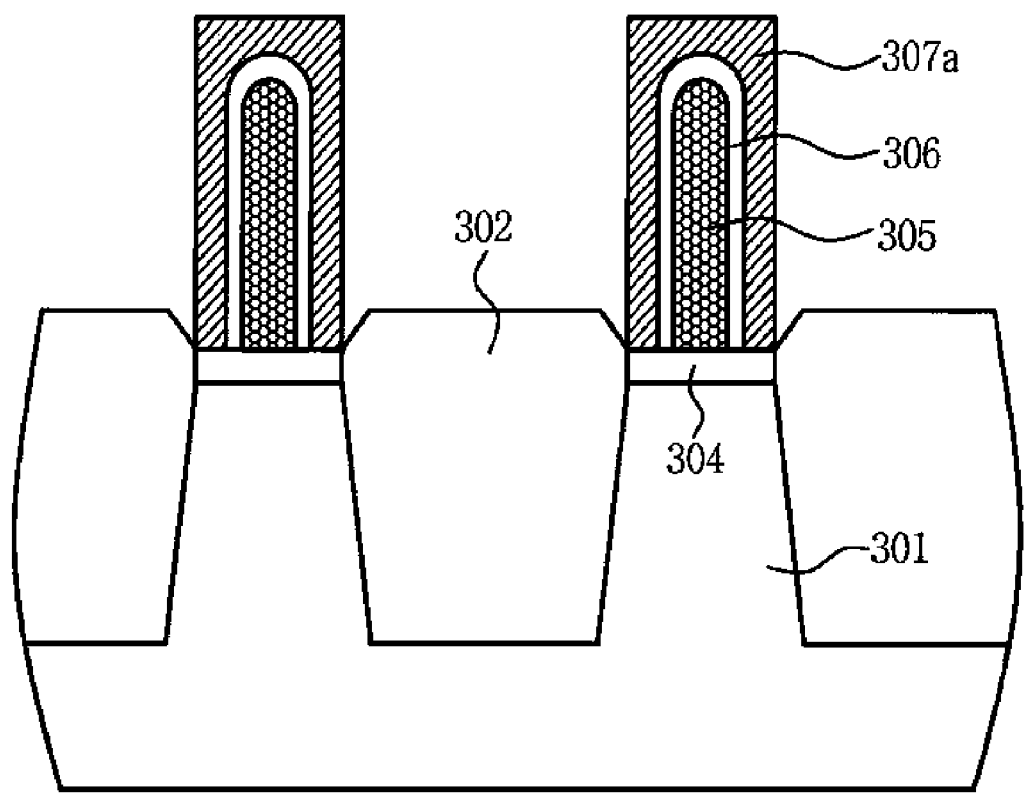

Referring to FIG. 7, the element isolation unit 302 is formed by etching the trench gap-fill insulating material 310 until the lateral portions of the first gate material 307a are exposed on the whole. The exposed etch mask film 308 is then removed.

Figure 8:
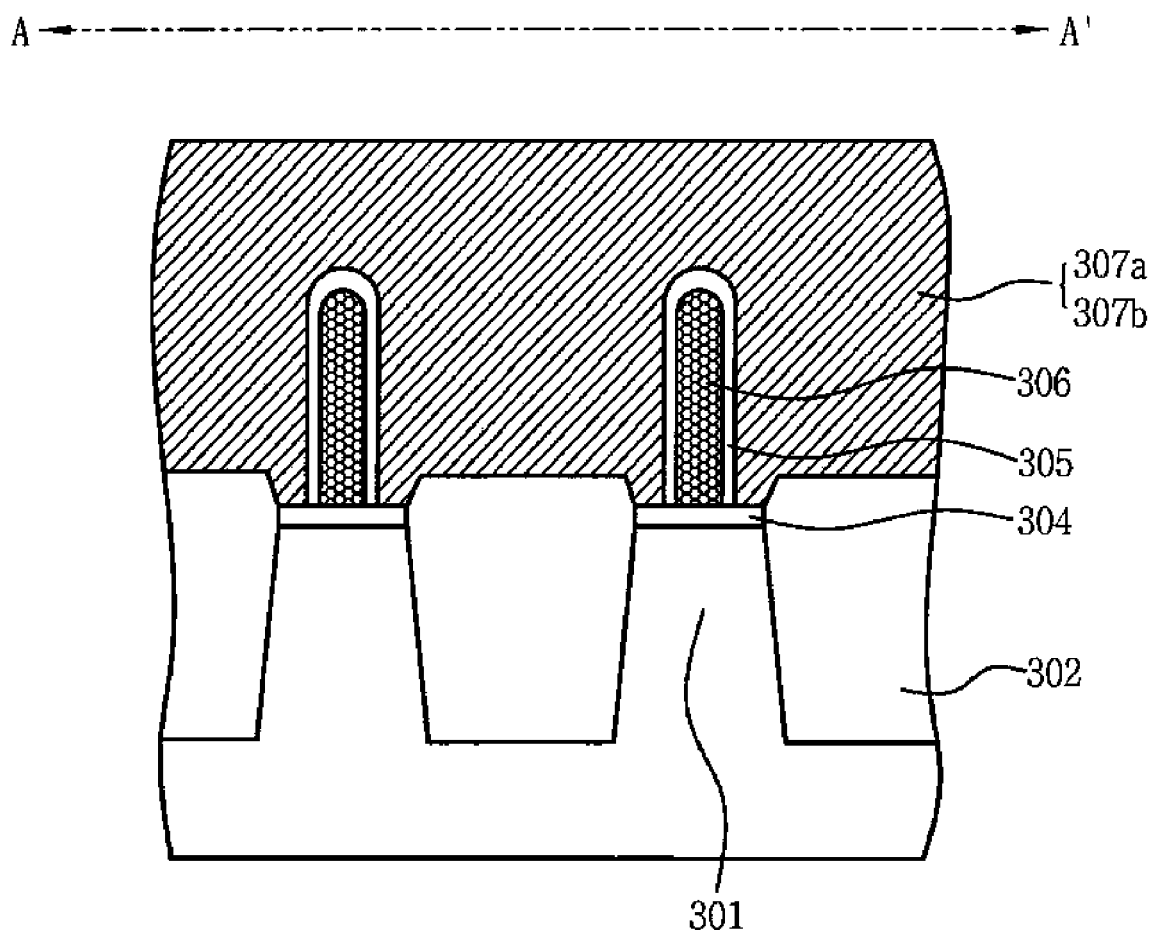

Referring to FIG. 8, the second gate material 307b is formed over the isolation units 302 and the first gate material 307a. The first gate material 307a or the second gate material 307b is patterned in such a way to surround the second oxide film 306 fully surrounding the carbon nanotube (CNT) 305. In this case, the second gate material 307b may be preferably formed by using the same material as that of the first gate material 307a. Consequently, the plurality of gate lines 307a and 307b, which intersect an upper side of the active regions 301 and the isolation units 302 and surround the carbon nanotube (CNT) 305 and the second oxide film 306, are formed. In this case, the second gate material 307b may be preferably formed from doped polysilicon or metal having the work function of 4.2 eV to 5.1 eV in the same manner as the first gate material 307a.

Finally, the source and drain (i.e., impurity regions) are formed within the active region 301 on both sides of the gate line 307 by using an ion implantation process, a diffusion process, and so on.

As described above, in accordance with the non-volatile memory cell and the method of fabricating the same according to the present invention, there is an advantage that a disturbance phenomenon that may occur due to the operation of neighboring cells can be minimized since the charge storage unit is fully surrounded by the gate line.

Further, the present invention is advantageous in that a high-integrated non-volatile memory cell and a method of fabricating the same.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A non-volatile memory cell, comprising:
   a substrate;
   a first oxide film formed over an active region of the substrate;
   a source and drain formed within the active region of the substrate;
   a charge storage unit formed on the first oxide film;
   a second oxide film configured to circumferentially surround the charge storage unit and formed on the first oxide film; and
   a gate formed to circumferentially surround the second oxide film.

2. The non-volatile memory cell of claim 1, wherein the charge storage unit is formed from carbon nanotube (CNT), fullerene, nitride or nanocrystalline material.

3. The non-volatile memory cell of claim 1, wherein the gate includes polysilicon or metal.

4. The non-volatile memory cell of claim 3, wherein the metal has a work function of 4.2 eV to 5.1 eV.

5. The non-volatile memory cell of claim 1, wherein the charge storage unit is oriented substantially perpendicular to the first oxide film.

6. The non-volatile memory cell of claim 1, wherein the charge storage unit is substantially cylindrical in shape.

7. The non-volatile memory cell of claim 1, wherein the source and drain are formed in a side by side planar orientation.

8. The non-volatile memory cell of claim 1, wherein at least a portion of the second oxide film is oriented substantially perpendicular to the first oxide film.

9. A non-volatile memory cell array, comprising:
   a substrate;
   an element isolation unit to define a plurality of active regions in the substrate;
   a source and drain formed within each of the plurality of active regions in the substrate;
   a first oxide film formed on each of the plurality of active regions in the substrate;
   a plurality of charge storage units formed on the first oxide film;
   a plurality of second oxide films formed on the first oxide film, each of the second oxide films configured to circumferentially surround one of the plurality of charge storage units; and
   gate lines configured to circumferentially surround the plurality of second oxide films disposed on a signal processing line and electrically connect the plurality of second oxide films.

10. The non-volatile memory cell array of claim 9, wherein the charge storage unit is formed from carbon nanotube (CNT), fullerene, nitride or nanocrystalline material.

11. The non-volatile memory cell array of claim 9, wherein the gate includes polysilicon or metal.

12. The non-volatile memory cell array of claim 11, wherein the metal has a work function of 4.2 eV to 5.1 eV.

13. The non-volatile memory cell array of claim 9, wherein the charge storage unit is oriented substantially perpendicular to the first oxide film.

14. The non-volatile memory cell array of claim 9, wherein the charge storage unit is substantially cylindrical in shape.

15. The non-volatile memory cell array of claim 9, wherein the source and drain are formed in a side by side planar orientation.

16. The non-volatile memory cell array of claim 9, wherein the element isolation unit is configured in the substrate between a first source and a second source or between a first drain and a second drain.

17. A non-volatile memory cell, comprising:
   a substrate;
   a first oxide film formed over an active region of the substrate;
   a source and drain formed within the active region of the substrate, the source and drain formed in a side by side planar orientation;
   a charge storage unit formed on the first oxide film and substantially perpendicular to the first oxide film, the charge storage unit being substantially cylindrical in shape;
   a second oxide film configured to circumferentially surround the charge storage unit and formed on the first oxide film; and
   a gate formed to on the second oxide film and configured to circumferentially surround at least a portion of the second oxide film that surrounds the charge storage unit.

18. The non-volatile memory cell of claim 17, wherein the charge storage unit is formed from carbon nanotube (CNT), fullerene, nitride or nanocrystalline material.

19. The non-volatile memory cell of claim 17, wherein the gate includes polysilicon or metal.

20. The non-volatile memory cell of claim 19, wherein the metal has a work function of 4.2 eV to 5.1 eV.

* * * * *